United States Patent [19]
Welch et al.

[11] Patent Number: 5,694,062
[45] Date of Patent: Dec. 2, 1997

[54] SELF-TIMED PHASE DETECTOR AND METHOD

[75] Inventors: James R. Welch, Maple Grove; Iain Ross Mactaggart, Eden Prairie, both of Minn.; Alan Fiedler, Palo Alto, Calif.

[73] Assignee: LSI Logic Corporation, Milpitas, Calif.

[21] Appl. No.: 595,854

[22] Filed: Feb. 2, 1996

[51] Int. Cl.$^6$ ................................................. H03P 13/00
[52] U.S. Cl. ........................................ 327/3; 327/156
[58] Field of Search .............................. 327/3, 5, 7, 8, 327/9, 12, 18, 20, 141, 146–150, 155–159; 331/17; 375/373, 375, 376

[56] References Cited

U.S. PATENT DOCUMENTS

| | | | |
|---|---|---|---|
| 4,712,224 | 12/1987 | Nelson | 377/43 |
| 4,750,193 | 6/1988 | Bailey | 327/157 |
| 4,821,296 | 4/1989 | Cordell | 375/119 |
| 5,081,655 | 1/1992 | Long | 375/119 |
| 5,115,455 | 5/1992 | Samaras et al. | 375/106 |
| 5,162,746 | 11/1992 | Ghoshal | 328/155 |
| 5,170,130 | 12/1992 | Ichihara | 327/157 |
| 5,200,980 | 4/1993 | Briddell | 375/83 |
| 5,208,546 | 5/1993 | Nagaraj et al. | 327/157 |
| 5,272,395 | 12/1993 | Vincelette | 307/355 |
| 5,278,873 | 1/1994 | Lowrey et al. | 375/118 |
| 5,280,205 | 1/1994 | Green et al. | 307/530 |
| 5,301,196 | 4/1994 | Ewen et al. | 370/105.2 |
| 5,361,229 | 11/1994 | Chiang et al. | 365/189.05 |
| 5,371,766 | 12/1994 | Gersbach et al. | 375/119 |
| 5,373,255 | 12/1994 | Bray et al. | 327/159 |
| 5,400,370 | 3/1995 | Guo | 375/118 |
| 5,475,326 | 12/1995 | Masuda | 327/148 |
| 5,577,079 | 11/1996 | Zenno et al. | 327/3 |
| 5,586,309 | 12/1996 | Lin | 327/147 |

OTHER PUBLICATIONS

"A 30 MHz High Speed Analog/Digital PLL in 2 µm CMOS," B. Kim et al., IEEE International Solid–State Circuits Convention, Digest of Technical Papers, pp. 104–105 (1990).

"Single Chip 1062 Mbaud CMOS Transceiver for Serial Data Communication," J. Ewen et al., IEEE International Solid–State Circuits Conference, Digest of Technical Papers, pp. 18–19, 32–33, 336, 340 (1995).

*Primary Examiner*—Timothy P. Callahan
*Assistant Examiner*—My-Trang Nu Ton
*Attorney, Agent, or Firm*—Westman, Champlin & Kelly, P.A.

[57] ABSTRACT

A self-timed phase detector for detecting the phase of an input signal, such as a high speed serial data stream. The self-timed phase detector includes a precharged latch, a phase detector circuit and a data valid gate. The precharged latch has a latch input, a sample clock input and first and second complementary latch outputs. The first and second complementary latch outputs have an active state and a precharged state. The phase detector circuit is coupled to the first latch output and generates a phase signal on a phase output as a function of the phase of the input signal. The data valid gate is coupled to the phase output for passing the phase signal when the latch outputs are in the active state and for blocking the phase signal when the latch outputs are in the precharged state.

17 Claims, 5 Drawing Sheets

5,694,062

SELF-TIMED PHASE DETECTOR AND METHOD

CROSS REFERENCE TO RELATED APPLICATIONS

Cross reference is hereby made to a U.S. Ser. No. 08/596,006 of Fiedler et al., entitled "System And Method For High Speed Data Capture Of A Serial Data Stream," and to a U.S. Ser. No. 08/595,821 of Mactaggart et al., entitled "High Speed Capture Latch," which were filed on even date herewith.

BACKGROUND OF THE INVENTION

The present invention relates to a self-timed phase detector and, more particularly, to a phase detector which suppresses invalid phase information and transfers valid phase information to a loop filter as soon as the phase information becomes valid.

Phase detectors and phase locked loops are used in integrated circuits, such as application specific integrated circuits (ASICs), for clock synchronization and recovery of serial data streams. Because of variations in the fabrication process, operating temperature, power supply levels, interconnects and routings, individual clock delays may be different from one integrated circuit to the next. These differences may create a clock skew between each integrated circuit and a system clock. Clock skew can significantly degrade system performance and make it difficult to synchronize an individual clock edge with the system clock edge.

Initially, an on-chip clock may be faster or slower than the system clock or incoming serial data stream and probably out of phase. To minimize clock skew and achieve synchronization, a phase locked loop is used to track the system clock or serial data stream, compare it with the on-chip clock, detect any phase or frequency difference and then make any necessary adjustments to the on-chip clock until the on-chip clock matches the system clock. The phase locked loop has then "locked-on" to the system clock.

Once every integrated circuit in the system is synchronized with the system clock, the entire system works in unison. If for any reason the operating conditions in the system should change, such as a temperature increase that degrades performance, the phase locked loop continues to track the system clock to restore normal operation. In data recovery applications, phase locked loops are used to lock a sample clock on to the phase and frequency of data transitions in high speed serial data streams. Serial data streams pass data at a very high rate from one integrated circuit to the next.

A typical phase locked loop includes a phase detector, a charge pump, a loop filter and a voltage-controlled oscillator ("VCO"). The VCO generates the on-chip clock with a phase and frequency that is a function of the voltage applied to the oscillator. The phase detector detects a phase or frequency difference between the system clock (or the serial data stream) and the VCO output. The phase detector generates a phase control signal as a function of the difference and applies the phase control signal to the charge pump, which increases or decreases a voltage across the loop filter. The oscillation frequency of the VCO increases or decreases as a function of the voltage across the loop filter.

When the system clock or serial data stream transitions are leading the VCO output signal transitions, the phase detector generates a phase control signal which causes the VCO to increase the frequency of the VCO output (and vice versa when the system clock or serial data stream transitions lag, or trail, the VCO output). When the VCO output matches the system clock in phase and frequency, the phase detector stops sending the control signal to the charge pump and the voltage across the loop filter stabilizes. The VCO output frequency then stabilizes and the phase locked loop has locked on to the system clock or serial data stream.

Unfortunately, conventional phase locked loops require substantial timing margins since phase information is updated at a fixed rate. If not enough margin is built in, then false phase information is fed to the VCO, which increases jitter and decreases lock range. If too much timing margin is built in, then the phase information is fed to the VCO at a slower rate, which can also increase jitter and decrease lock range. An improved phase detector is needed to increase bandwidth, reduce jitter, increase lock range and remove the possibility of false phase information from being fed to the VCO.

SUMMARY OF THE INVENTION

The self-timed phase detector of the present invention detects the phase of an input signal, such as a system clock or a serial data stream, and provides phase information only when the phase information is valid. The phase detector includes a precharged latch, a phase detector circuit and a data valid gate. The latch has a latch input for receiving the input signal, a sample clock input for receiving a sample clock signal and first and second complementary latch outputs which have active and precharged states. The phase detector circuit is coupled to the first latch output and has a phase output. The phase detector circuit provides a phase signal on the phase output as a function of the phase of the input signal. The data valid gate is coupled to the phase detector output. The data valid gate passes the phase signal when the latch outputs are in the active state and blocks the phase signal when the latch outputs are in the precharged state.

In one embodiment, the data valid gate includes an AND gate having one input coupled to the phase output and another input coupled to the output of an exclusive-OR gate which is coupled across the first and second latch outputs. The latch outputs are held in the precharged state until the sample clock becomes active. Once the sample clock becomes active, the latch outputs tend toward complementary logic states as a function of the input signal. The exclusive-OR gate detects whether the latch outputs have the same logic state and, if so, provides a logic LOW signal on its output indicating that the data in the latch is not valid. The logic LOW signal holds the output of the AND gate LOW, which prevents an invalid phase signal from passing through the AND gate. Once the sample clock becomes active and the latch outputs become complementary, the output of the exclusive-OR gate becomes HIGH, which allows the phase signal to pass through the AND gate.

A variety of combinational logic configurations can be used to detect whether the latch outputs are in the active state or in the precharged state in accordance with the present invention. Other examples include a NAND gate, an OR gate and an automatic transition detector.

DETAILED DESCRIPTION OF THE PREFERRED EMBODIMENTS

The phase detector and phase locked loop of the present invention rapidly recover data and clock signals from a high speed serial data stream through a multiple-bit capture latch which is controlled by multiple phases of a sample clock. The phase detector has inherently zero phase error since it uses the same capture latch elements that are used to capture data.

The phase detector also has a self timing feature which updates phase correction information only after the information becomes valid and thereby reduces jitter, increases lock range of phase locked loops and removes a possibility of false phase information from being fed to a phase locked loop. The self timing feature also increases bandwidth.

Figure 1:
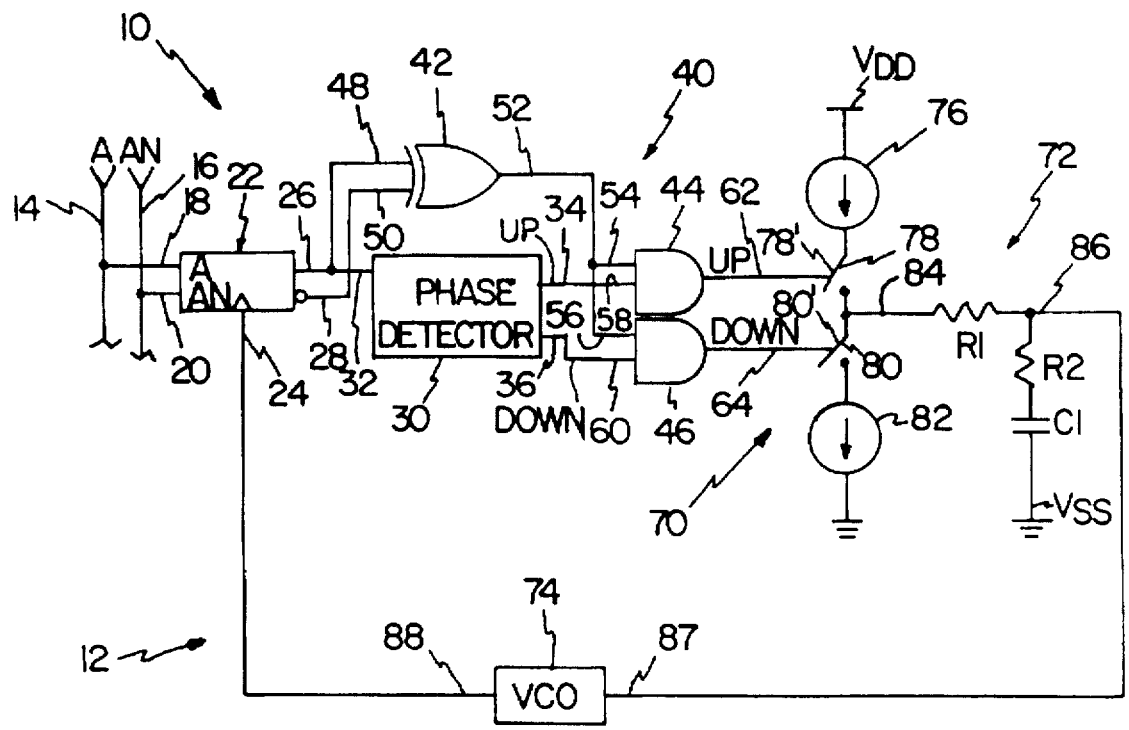
FIG. 1 is a simplified block diagram of a phase detector and a phase locked loop in accordance with the present invention.

FIG. 1 is a simplified block diagram of the phase detector and phase locked loop of the present invention, which illustrates the self-timing feature. Phase detector 10 forms part of a phase locked loop 12 which locks onto the phase of an input signal applied to detector inputs 14 and 16. The input signal can include a clock signal or a serial data stream, for example. Detector inputs 14 and 16 are coupled to latch inputs 18 and 20 of a plurality of precharged capture latches 22 (for simplicity, only one latch is shown in FIG. 1). Latch inputs 18 and 20 can be configured for receiving a differential analog signal, a pair of complementary digital signals or a single digital signal. Latch 22 includes a sample clock input 24 and complementary latch outputs 26 and 28.

Latch outputs 26 and 28 are "precharged" to the same logic level, such as a HIGH level, a LOW level or an intermediate level when a sample clock applied to sample clock input 24 is inactive. When the sample clock becomes active, latch outputs 26 and 28 tend toward complementary logic states as a function of the relative polarities or the relative logic states of the input signals applied to latch inputs 18 and 20. For example, if latch outputs 26 and 28 are precharged to a HIGH level, on the active edge of the sample clock one of the latch outputs 26 and 28 will fall to a LOW level while the other output will remain at a HIGH level. When the sample clock becomes inactive again, latch outputs 26 and 28 return to the HIGH, precharged state. Latch outputs 26 and 28 thus switch between an "active state" and a "precharged state" under control of the sample clock. An example of a suitable precharged latch is described in greater detail in a co-pending U.S. Ser. No. 08/595,821 of Mactaggart et al. entitled "High Speed Capture Latch," which was filed date herewith and is hereby incorporated by reference.

A phase detector 30 has a phase input 32 for each of the captive latches 22 and has phase outputs 34 and 36. Phase input 32 is coupled to latch output 26. Phase detector 30 generates phase signals on phase outputs 34 and 36 which are representative of a difference between a phase of the input signal and a phase of the sample clock, as described in more detail with reference to FIG. 5 below. Phase detector 30 applies a HIGH signal on phase output 34 (labeled "up") when the phase of the sample clock lags the phase of the differential input signal to indicate that the phase of the sample clock should be advanced. Phase detector provides a HIGH signal on phase output 36 (labeled "down") when the phase of the sample clock leads the phase of the input signal to indicate that the phase of the sample clock should be delayed. The phase signals applied to phase outputs 34 and 36 are fed to phase locked loop 12 which advances, delays or maintains the phase of the sample clock at sample clock input 24. Phase detector 30 is described in more detail below with reference to FIGS. 5 and 6.

The phase signals applied to phase outputs 34 and 36 are gated by a data valid circuit 40 which prevents the sample clock phase from being updated until the data in latch 22, and thus the phase correction information, is valid. Data valid circuit 40 includes exclusive-OR gate 42, AND gate 44 and AND gate 46. Exclusive-OR gate 42 has an input 48 coupled to latch output 26, an input 50 coupled to latch output 28 and a data valid output 52 coupled to inputs 54 and 56 of AND gates 44 and 46. Inputs 58 and 60 of AND gates 44 and 46 are coupled to phase outputs 34 and 36, respectively, of phase detector 30. Outputs 62 and 64 of AND gates 44 and 46 provide gated phase control signals to phase locked loop 12.

When the sample clock applied to sample clock input 24 is active, latch outputs 26 and 28 are complementary. The output of exclusive-OR gate 42 is at a HIGH level, indicating that latch outputs 26 and 28 are valid. A HIGH level on data valid output 52 allows the phase signals on outputs 34 and 36 to pass through AND gates 44 and 46 to detector outputs 62 and 64.

When the sample clock signal returns to the inactive state, latch outputs 26 and 28 return to the same, precharged state such that data valid output 52 goes LOW. The LOW level on data valid output 52 holds the outputs of AND gates 44 and 46 LOW, which blocks the phase signals on phase outputs 34 and 36. Thus, false phase information is not supplied to detector outputs 62 and 64 when the data in latch 22 is not valid.

Phase locked loop 12 includes charge pump 70, loop filter 72 and voltage controlled oscillator ("VCO") 74. Charge pump 70 is a switched current source which includes current source 76, switch 78, switch 80, current source 82 and charge pump output node 84. Current source 76 is coupled to voltage supply terminal $V_{DD}$. Switch 78 is coupled between current source 76 and charge pump output node 84. Switch 78 has a control terminal 78' which is coupled to detector output 62. Switch 80 is coupled between node 84 and current source 82. Switch 80 has a control terminal 80' which is coupled to detector output 64. Current source 82 is coupled to voltage supply terminal $V_{SS}$.

Loop filter 72 includes resistors R1 and R2, capacitor C1 and output node 86. Resistor R1 is coupled between nodes 84 and 86. Resistor R2 and capacitor C1 are coupled in series between node 86 and voltage supply terminal $V_{SS}$.

VCO 74 has a voltage control input 87 which is coupled to node 86 and a sample clock output 88 which is coupled to sample clock input 24. VCO 74 generates the sample clock on sample clock output 88 which has a phase and frequency that is controlled by the voltage on node 86. The gated phase signals on detector outputs 62 and 64 operate switches 78 and 80 to charge, discharge or maintain the voltage on node 86 of loop filter 72. A logic HIGH signal on detector output 62 closes switch 78 to allow current source 76 to charge capacitor C1 through resistors R1 and R2 and thereby increment the voltage on node 86, which advances the phase and increases the frequency of VCO 74. A logic HIGH signal on detector output 64 closes switch 80 to allow current source 82 to discharge capacitor C1 through resistors R1 and R2 and thereby decrement the voltage on node 86, which delays the phase and decreases the frequency of VCO 74.

If neither of detector outputs 62 and 64 is a logic HIGH, there will be no change in the voltage on node 86 or the phase and frequency of VCO 74. Therefore, when the data in latch 22 is invalid such that data valid output 52 holds the outputs of AND gates 44 and 46 LOW, there is no change in the voltage on node 86 and no change in the phase or frequency of the sample clock signal. Data valid circuit 40 thus prevents phase information from being fed to phase locked loop 12 until the data in latch 22 is valid. Data valid circuit 40 allows phase correction information in a phase locked loop to be updated at the fastest possible rate while preventing false phase correction information. This maximizes phase correction bandwidth, decreases jitter and increases lock range of the phase locked loop.

Figure 2:
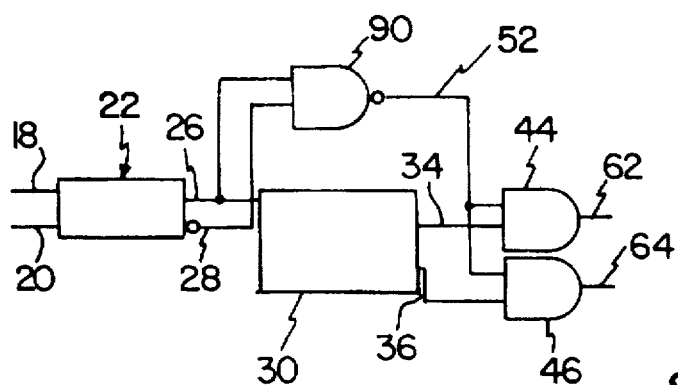
FIG. 2 is a diagram of an alternative data valid detector for the phase detector shown in FIG. 1.

Data valid circuit 40 can have a variety of configurations. FIG. 2 is a partial block diagram of a phase detector according to an alternative embodiment of the present invention. The same reference numerals are used in FIG. 2 as were used in FIG. 1 for similar elements. In the embodiment shown in FIG. 2, exclusive-OR gate 42 is replaced with NAND gate 90. If latch 22 precharges latch outputs 26 and 28 to a logic HIGH level, as opposed to a logic LOW level, then the output of NAND gate 90 is an indication of whether the data in latch 22 is valid. Whenever both latch outputs 26 and 28 are HIGH, data valid output 52 is LOW to indicate that the data in latch 22 is invalid. Once one of the latch outputs 26 and 28 falls to a logic LOW level, the data in latch 22 is valid and data valid output 52 goes HIGH, which allows the phase signals on phase outputs 34 and 36 to pass through AND gates 44 and 46.

Figure 3:
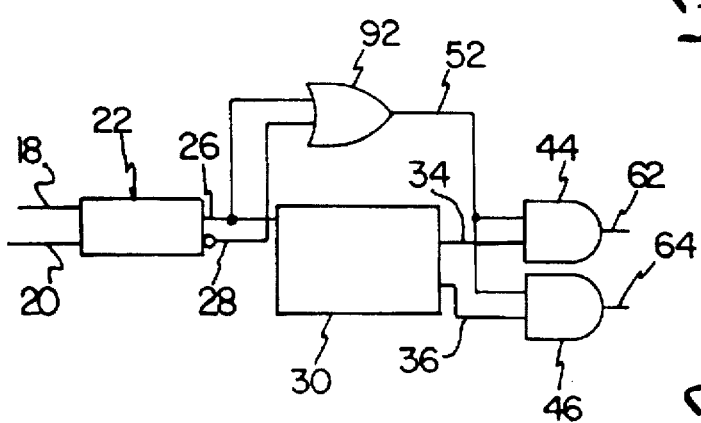
FIG. 3 is a diagram of another alternative data valid detector for the phase detector shown in FIG. 1.

In FIG. 3, exclusive-OR gate 42 is replaced with OR gate 92. If latch 22 precharges latch outputs 26 and 28 to a logic LOW level, as opposed to a logic HIGH level, then the output of OR gate 92 indicates whether the data in latch 22 is valid. If both latch outputs 26 and 28 are LOW, the output of OR gate 92 is LOW, which holds the output of AND gates 44 and 46 LOW. If one of the latch outputs 26 and 28 goes HIGH, the data in latch 22 is valid and the output of OR gate 92 goes HIGH, which allows the phase signals on phase outputs 34 and 36 to pass through AND gates 44 and 46.

Figure 4:
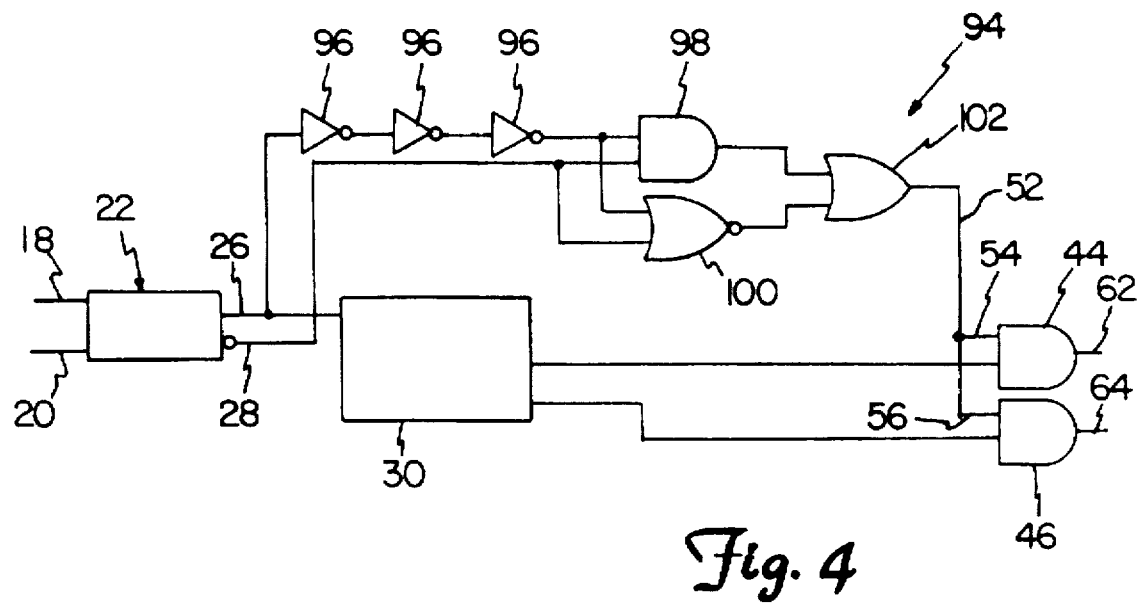
FIG. 4 is a diagram of another alternative data valid detector for the phase detector shown in FIG. 1.

In FIG. 4, exclusive-OR logic gate 42 is replaced with an automatic transition detector 94. Automatic transition detector 94 includes a serial string of delay inverters 96, an AND gate 98, a NOR gate 100 and an OR gate 102. Delay inverters 96 are coupled between latch output 26 and first inputs of AND gate 98 and NOR gate 100. Latch output 28 is coupled to second inputs of AND gate 98 and NOR gate 100. The outputs of AND gate 98 and NOR gate 100 are fed to OR gate 102. The output of OR gate 102 is fed to AND gates 44 and 46. Assuming latch outputs 26 and 28 are precharged to a logic HIGH level, whenever one of the latch outputs falls to a logic LOW level OR gate 102 generates a logic HIGH pulse on data valid output 52, which updates the phase signals on detector outputs 62 and 64.

Figure 5:
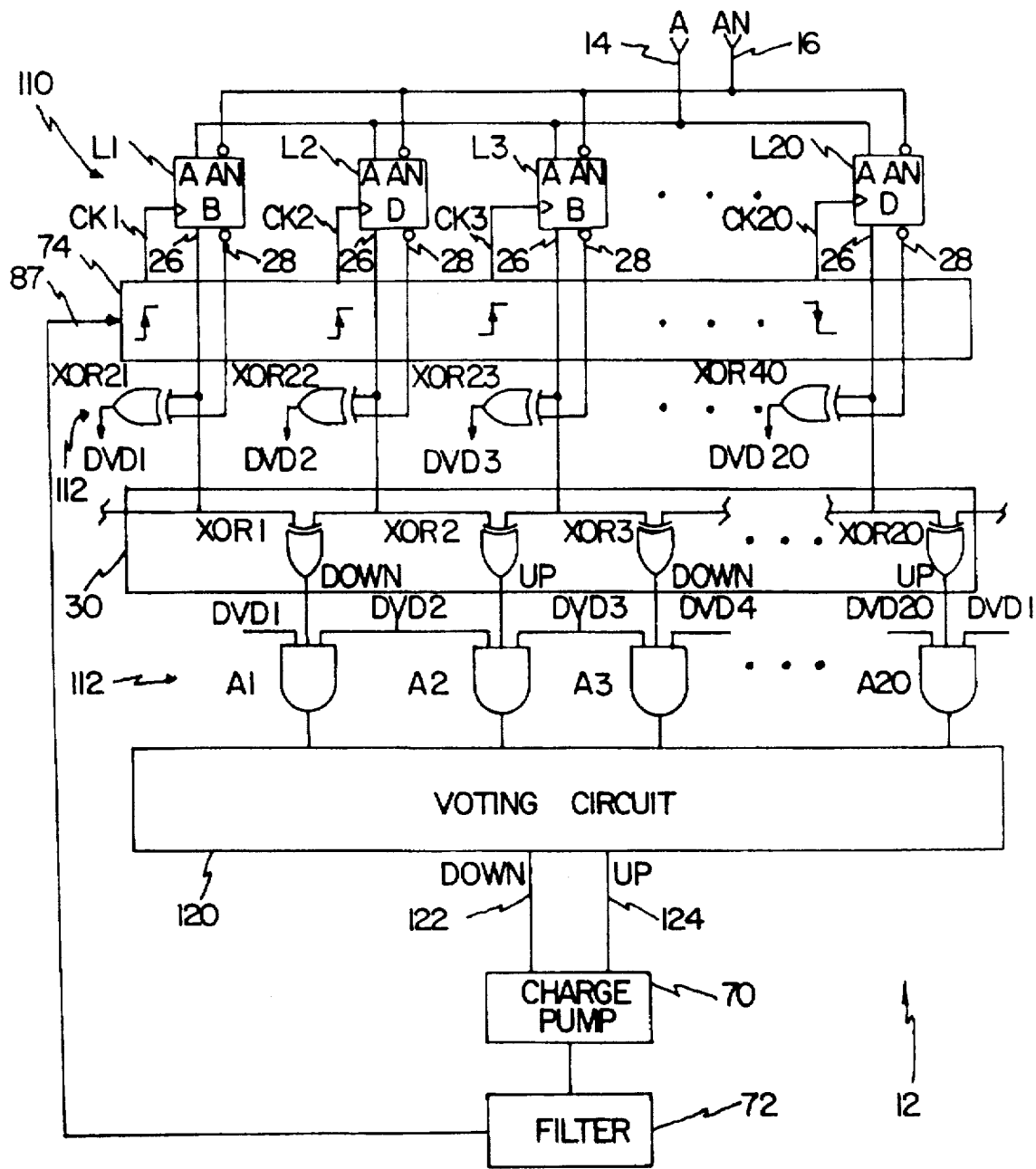
FIG. 5 is a detailed block diagram of the phase detector and phase locked loop shown in FIG. 1.

FIG. 5 is a block diagram of phase locked loop 12, which illustrates the high speed capture latches, phase detector 30 and data valid circuit 40 in greater detail. Phase locked loop 12 includes a multiple-bit capture latch 110 for sampling the serial data stream that is applied to detector inputs 14 and 16. Capture latch 110 includes individual latch elements L1–L20 (L4–L19 not shown) which sample the data stream at slightly different phases in response to sample clock signals CK1–CK20 (CK4–CK19 not shown). Each latch element corresponds to either a data bit or a boundary between data bits (i.e. a transition). Latch elements L1–L20 are labeled "D" and "B" to indicate data capture latch elements and boundary-detect capture latch elements, respectively.

A typical data stream is divided into groups of N bits of data. Capture latch 110 preferably includes an even number of latch elements for each of the N bits of data in the group. The delay between latch elements is preferably maintained at approximately an inverse of an even integer multiple of the data transition frequency such that one data latch element is centered on each data bit and one boundary-detect latch element is centered on each transition.

In the embodiment shown in FIG. 5, there are two latch elements for each data bit, which sample the data stream at twice the transition frequency. For example, if the data in the stream is divided into groups of ten bits, twenty latch elements L1–L20 are used to sample the ten data bits during a single clock cycle at slightly different phases.

The phase and frequency at which each latch element samples the data stream is controlled by VCO 74 which has multiple stages or phases for generating sample clock signals CK1–CK20. Each sample clock signal is delayed from the previous clock signal by an adjustable delay, such as 500 picoseconds (ps), which is based on the voltage applied to voltage control input 87. By using multiple capture latch elements and multiple phases of the sample clock, the phase detector of the present invention can sample the data at a very high rate while the oscillator oscillates at only a fraction of the data transition frequency.

Each sample clock generated by VCO 74 has a plurality of cycles, with each cycle having a positive phase and a negative phase. The frequency at which VCO 74 must oscillate can be further reduced by a factor of two by organizing the latch elements into two groups which sample the data stream on opposite phases of the sample clocks. For example, if clocks CK11–CK20 correspond to the negative phase or edge of sample clocks CK1–CK10, respectively, then only ten sample clock signals are required to trigger latches L1–L20. Latch elements L1–L10 sample the data stream on the positive phase of sample clocks CK1–CK10 while latch elements L11–L20 sample the data stream on the negative phase of sample clocks CK1–CK10 (i.e. CK11–CK20).

Phase detector 30 looks for the transitions in the input data stream and adjusts the phase and frequency of VCO 74 to match the phase and frequency of the transitions. For example, consider a case where a leading data capture latch captures a "1" and the subsequent in time data capture latch captures a "0". Phase detector 30 uses the result at the output of the intermediate boundary-detect capture latch (being clocked by a phase intermediate of the leading data capture latch and the subsequent data capture latch) to determine if the clock transition is leading or lagging the data transition. If the boundary-detect capture latch captures a "1", the clock transition for the boundary-detect capture latch is leading the data transition since the subsequent data bit is a "0" not a "1". If the boundary-detect capture latch captures a "0", then the clock transition is trailing the data transition. If the leading data capture latch and the subsequent data capture latch both capture a "0" or a "1", no determination of relative phase can be made.

Phase detector 30 determines phase with an exclusive-OR tree formed by a plurality of exclusive-OR gates XOR1–XOR20 (XOR4–XOR19 not shown). The inputs of XOR1 are coupled to latch outputs 26 of capture latches L1 and L2. The inputs of XOR2 are coupled to latch outputs 26 of capture latches L2 and L3. The inputs of XOR3 are coupled to latch outputs 26 of capture latches L3 and L4 (L4 not shown). The inputs of XOR20 are coupled to latch outputs 26 of capture latches L20 and L1. The inputs of XOR4–XOR19 are coupled in a similar fashion.

Exclusive-OR gates XOR1–XOR20 are labeled "down" and "up" to indicate which exclusive-OR gates "slow down" VCO 74 by increasing the delay between each sample clock signal and which exclusive-OR gates "speed up" VCO 74 by decreasing the delay between each sample clock signal. The exclusive-OR gates that follow a boundary-detect capture latch and precede a data capture latch are referred to as "down" exclusive-OR gates. The exclusive-OR gates that follow a data capture latch and precede a boundary-detect capture latch are referred to as "up" exclusive-OR gates.

A data transition between boundary-detect capture latch L1 and data capture latch L2 generates a logic HIGH level (or "true" state) on the output of XOR1 indicating that VCO 74 should be delayed slightly since boundary-detect capture latch L1 latched before the actual data transition. A transition between data capture latch L2 and boundary-detect capture latch L3 generates a logic HIGH level on XOR2 indicating that VCO 74 should be advanced slightly, since boundary detect capture latch L1 latched after the actual data transition. A logic LOW level (or "false" state) on the outputs of exclusive-OR gates XOR1–XOR20 indicates that no change in the phase or frequency of VCO 74 is required.

The outputs of exclusive-OR gates XOR1–XOR20 form phase signals which are fed to voting circuit 120 through AND gates A1–A20. Voting circuit 120 compares the relative number of "down" exclusive-OR gates having a logic HIGH output with the number of "up" exclusive-OR gates having a logic HIGH output. If there are more "downs" than "ups", voting circuit 120 generates a logic HIGH level on phase control output 122 causing charge pump 70 to discharge the voltage across loop filter 72 slightly which causes VCO 74 to delay clock signals CK1–CK20. If there are more "ups" than "downs", voting circuit 120 generates a logic HIGH level on phase control output 124 causing charge pump 70 to increase the voltage across loop filter 72 slightly which causes VCO 74 to advance clock signals CK1–CK20.

If all "up" and "down" exclusive-OR gates are LOW or the number of "ups" and "downs" are equal, charge pump 70 makes no change to the voltage across filter 72. In one embodiment, voting circuit 120 is implemented with combinational logic.

Data valid circuit 112 prevents the phase signals from being applied to charge pump 70 until the data in capture latches L1–L20 are valid. The data valid circuit includes AND gates A1–A20 (A4–A19 not shown) and exclusive-OR gates XOR21–XOR40 (XOR24–XOR39 not shown). Exclusive-OR gates XOR21–XOR40 are coupled across latch outputs 26 and 28 of capture latches L1–L20, respectively. Data valid outputs DVD1–DVD20 of exclusive-OR gates XOR21–XOR40 indicate when the data in latches L1–L20 are valid. AND gates A1–A20 are coupled between exclusive-OR gates XOR1–XOR20 and voting circuit 120 to gate the phase signals with data valid outputs DVD1–DVD20. The output of each exclusive-OR gate XOR1–XOR20 is gated with the data valid outputs that correspond to the inputs of that exclusive-OR gate.

In an alternative embodiment, only the data valid output corresponding to the later in time capture latch is used to gate the outputs of exclusive-OR gates XOR1–XOR20. For example, the output of exclusive-OR gate XOR1 can be gated with only data valid output DVD2. This allows two-input AND gates to be used as opposed to three-input AND gates, which reduces the number of transistors required to implement the present invention. The data valid circuit formed by XOR21–XOR40 and A1–A20 can be used to gate the output of any phase detector that uses a precharged latch with complementary outputs to detect bit transitions. The particular phase detector shown in FIG. 5 is provided as an example only.

Figure 6A:
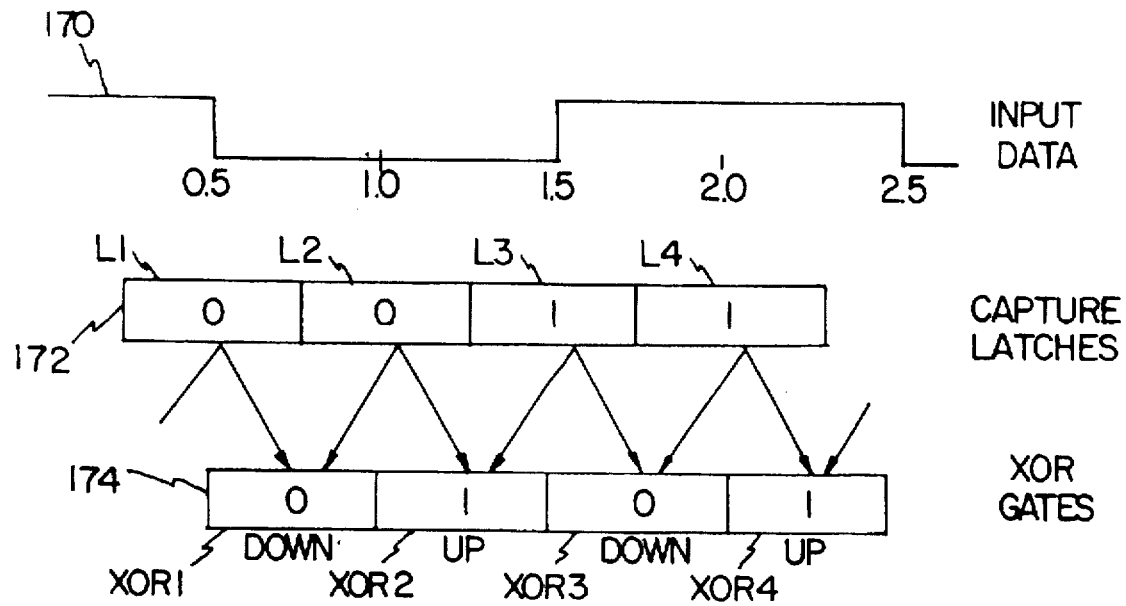
FIGS. 6a and 6b are generated representative diagrams illustrating two operating states of the phase detector and phase locked loop shown in FIG. 5.
Figure 6B:
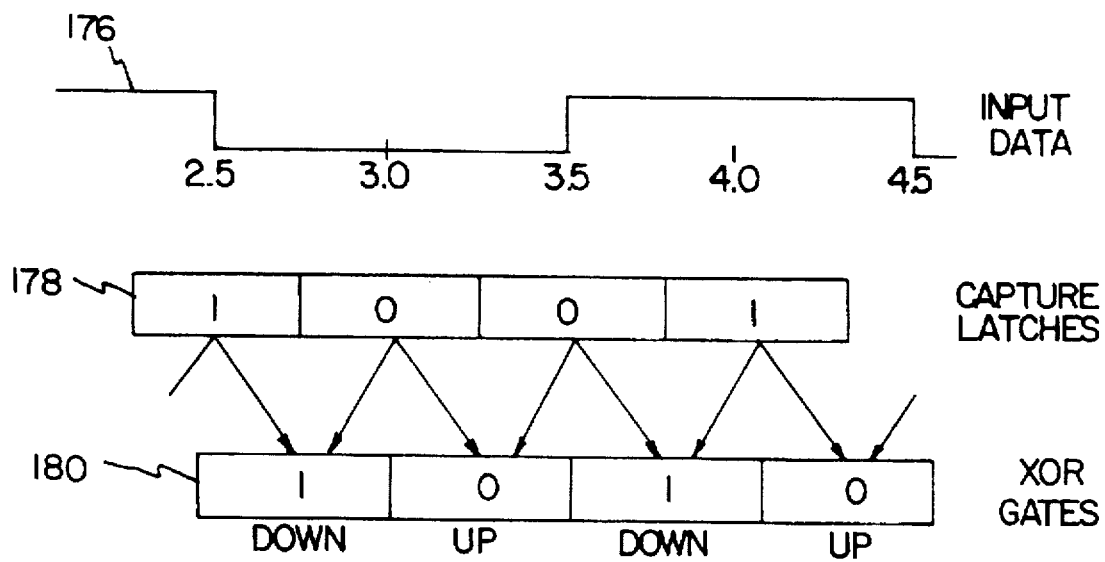

FIGS. 6a and 6b are generated representative diagrams illustrating two operating states of the phase locked loop shown in FIG. 5. For simplicity, assume there are only four capture latches, L1–L4. Waveform 170 in FIG. 6a is a digital representation of a two bit differential serial data stream applied to detector terminals 14 and 16 over time in nanoseconds. There are data transitions at 0.5 nanoseconds (ns), 1.5 ns and 2.5 ns. The center of a logic "0" data bit is shown at 1.0 ns and the center of a logic "1" data bit is shown at 2.0 ns.

Block 172 represents the data in capture latches L1, L2, L3 and L4 at a present phase and frequency adjustment of VCO 74. If the clock transitions for capture latches L1–L4 trigger at 0.6, 1.1, 1.6 and 2.1 ns, respectively, then the clock transitions slightly lag the data transitions. The data in capture latches L1–L4 will therefore be "0011," as shown in block 172.

Block 174 represents the outputs of exclusive-OR gates XOR1–XOR4, which detect transitions in data between capture latches L1–L4. Since the data in capture latches L1 and L2 are the same, the output of XOR1 is a "0". Since the data in capture latches L2 and L3 are different, the output of XOR2 is a "1". Since the data in capture latches L3 and L4 are the same, the output of XOR3 is a "0". Since the data in capture latches L4 and L1 are different, the output of XOR4 is a "1". The "down" exclusive-OR gates XOR1 and XOR3 indicate no change in delay between sample clocks is required and the "up" exclusive-OR gates XOR2 and XOR4 indicate that the delay should be decreased. Voting circuit 120 (shown in FIG. 5) detects a greater number of "up" phase signals and advances the phase and frequency of VCO 74 accordingly.

In FIG. 6b, waveform 176 is a digital representation of the two bit data stream during the next clock cycle. Block 178 represents the data in capture latches L1–L4. With the phase of the sample clocks advanced slightly, capture latches L1–L4 now sample the input data stream at 2.4, 2.9 and 3.4 and 3.9 ns, which slightly leads the data transitions. The data in capture latches L1–L4 will be "1001," as shown in block 178. Block 180 represents the outputs of exclusive-OR gates XOR1–XOR4. The "1's" are now in the "down" slots indicating that the phase of the sample clock leads the phase of the data transitions. VCO 74 will therefore be delayed and the outputs of exclusive-OR gates XOR1–XOR4 will shift back to the states shown in block 174. Once the outputs of exclusive-OR gates XOR1–XOR4 begin to toggle back and forth between the states shown in blocks 174 and 180, the phase locked loop has locked onto the phase of the input data stream.

Figure 7:
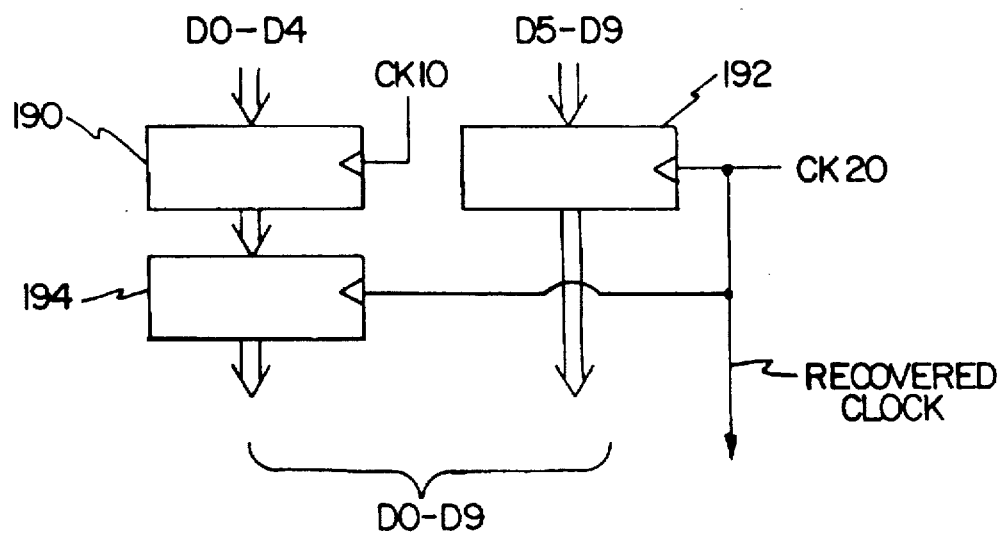
FIG. 7 is a diagram of a data recovery circuit.

In a data recovery application, the latch outputs of each of the ten data capture latches (shown in FIG. 5) are clocked into a data recovery storage element at a rate determined by VCO 74, which has locked onto the phase and frequency of the input data stream. FIG. 7 is a diagram illustrating a data recovery storage element according to one embodiment of the present invention. The outputs of the first five data capture latches (L2, L4, L6, L8 and L10) are clocked as data bits D0-D4 into element 190 with the rising edge of clock signal CK10. Clock signal CK10 represents a time at which the first five data bits have been latched in the first five data capture latches.

The outputs of the last five data capture latches (L12, L14, L16, L18 and L20) are clocked as data bits D5-D9 into storage element 192 at the rising edge of clock signal CK20. The rising edge of clock signal CK20 represents a time at which the last five data bits have been latched in the last five data capture latches. Clock signal CK20 is also used to clock data bits D0-D4 into storage element 194 as bits D5-D9 are being clocked into storage element 192. At the next rising edge of clock signal CK20, all ten data bits D0-D9 are available and can be clocked out of elements 192 and 194.

Data bits D0-D4 and D5-D9 are separated from one another such that the capture latches corresponding to bits D0-D4 can capture new data while bits D5-D9 are being clocked into element 192, thereby further increasing the speed of data recovery. Storage elements 190, 192 and 194 can include any suitable storage element, such as a register, latch or flip-flop. The data capture latches can be grouped as desired and any suitable sample clock or clock phase can be used to recover the data in the capture latches. The selected sample clock can be used both as a data recovery clock and as a synchronized, recovered core clock in embodiments in which the phase detector and phase locked loop are embedded in an integrated circuit, such as an application specific integrated circuit (ASIC).

Figure 8:
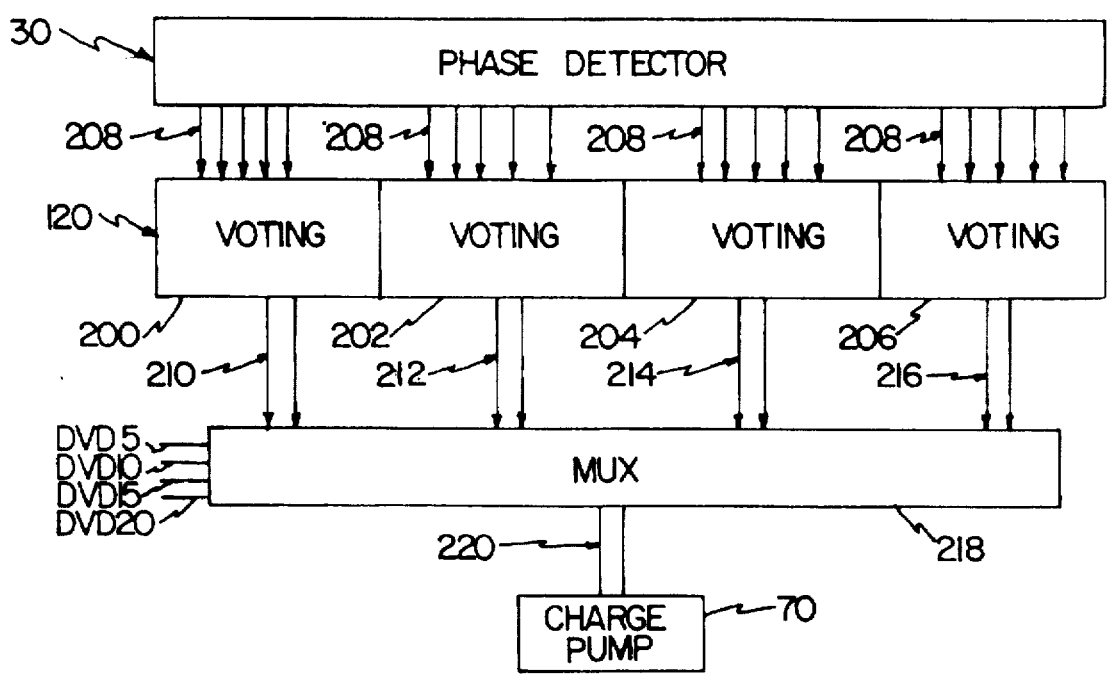
FIG. 8 is a partial diagram of a phase detector according to an alternative embodiment of the present invention.

FIG. 8 is a block diagram of an embodiment of the present invention in which voting circuit 120 is divided into four voting circuits 200, 202, 204 and 206. Phase outputs 208 of phase detector 30 are divided into four groups of five and supplied to respective voting circuits 200, 202, 204 and 206. Each voting circuit generates a majority "up" or "down" phase control output 210, 212, 214 and 216 to a multiplexer 218. Multiplexer 218 has four control terminals which are coupled to data valid outputs DVD5, DVD10, DVD15 and DVD20. Data valid outputs DVD5, DVD10, DVD15 and DVD20 select which of the majority phase control outputs 210, 212, 214 or 216 will be provided at output 220 to charge pump 70. Once each group of five capture latches 208 becomes valid, the corresponding phase information is supplied to charge pump 70 through multiplexer 218. Multiplexer 218 therefore maximizes the rate at which the phase information can be updated and thereby further increases phase correction bandwidth. The phase outputs and voting circuits can be grouped in any manner, with the appropriate data valid signals being used to control the multiplexer.

The phase detector of the present invention is capable of capturing data at a very high rate, such as one gigabit per second. The multiple-bit capture latch samples the data with multiple phases of a sample clock while the oscillator oscillates at a fraction of the incoming data rate. The operating frequency of the oscillator is no longer a limit on the maximum rate at which data can be captured. Phase alignment is accomplished using boundary-detect capture latches which, when phase locked, are clocked at the expected data transition rate. There is inherently zero phase error since phase detection is made using the very same capture latches that are used to capture the data.

The self timing feature in the data valid circuit updates phase correction information only after the information becomes valid and thereby reduces jitter, increases lock range and removes a possibility of false phase information from being fed to the phase locked loop. The self timing feature also increases bandwidth.

Although the present invention has been described with reference to preferred embodiments, workers skilled in the art will recognize that changes may be made in form and detail without departing from the spirit and scope of the invention. For example, the phase detector and phase locked loop can be implemented with a variety of components and in a variety of configurations. The circuit configurations shown herein are provided as examples only. Individual signals can be active HIGH or LOW, and corresponding circuitry can be converted to suit a particular convention. The present invention can be implemented with discrete components, digital logic that is embedded in an integrated circuit or a combination of both. The major functions of the present invention can also be implemented in software, if desired. In addition, various phase detection schemes and phase locked loop configurations can be used in accordance with the present invention. The term "coupled" used in the specification and in the claims includes various types of connections or couplings and includes a direct connection or a connection through one or more intermediate components. The term "latch" includes level and edge sensitive storage elements, such as a traditional latch or an edge triggered flip-flop.

What is claimed is:

1. A self-timed phase detector for detecting a phase of an input signal, comprising:

a detector input for receiving the input signal;

a detector output;

a precharged latch having a latch input coupled to the detector input, a sample clock input, and first and second complementary latch outputs which have an active state and a precharged state;

a sample clock generator coupled to the sample clock input;

a phase detector circuit having a phase input coupled to the first latch output and having a phase output, wherein the phase detector circuit provides a phase signal on the phase output; and gate means coupled to the first and second complementary latch outputs and between the phase output and the detector output for passing the phase signal to the detector output when the latch outputs are in the active state and for blocking the phase signal when the latch outputs are in the precharged state.

2. The self-timed phase detector of claim 1 wherein the gate means comprises:

an exclusive-OR logic gate having a first input coupled to the first latch output, a second input coupled to the second latch output and a data valid output; and an AND logic gate having a first input coupled to the data valid output, a second input coupled to the phase output and a gate output coupled to the detector output.

3. The self-timed phase detector of claim 1 wherein the precharged state comprises a logic HIGH state and the gate means comprises:

a NAND logic gate having a first input coupled to the first latch output, a second input coupled to the second latch output and a data valid output; and an AND logic gate having a first input coupled to the data valid output, a second input coupled to the phase output and a gate output coupled to the detector output.

11

4. The self-timed phase detector of claim 1 wherein the precharged state comprises a logic LOW state and the gate means comprises:
- an OR logic gate having a first input coupled to the first latch output, a second input coupled to the second latch output and a data valid output; and
- an AND logic gate having a first input coupled to the data valid output, a second input coupled to the phase output and a gate output coupled to the detector output.

5. The self-timed phase detector of claim 1 wherein the gate means comprises:
- a transition detector having a first input coupled to the first latch output, a second input coupled to the second latch output and a data valid output; and
- an AND logic gate having a first input coupled to the data valid output, a second input coupled to the phase output and a gate output coupled to the detector output.

6. The self-timed phase detector of claim 1 wherein the sample clock generator comprises:
- a charge pump coupled to the detector output;
- a loop filter coupled to the charge pump; and
- a voltage controlled oscillator coupled between the loop filter and the sample clock input.

7. The self-timed phase detector of claim 1 and further comprising:
- a plurality of precharged latches, with each latch having a latch input coupled to the detector input, a sample clock input, and first and second complementary latch outputs;
- the sample clock generator comprises a multiple-stage sample clock generator having a plurality of sample clock outputs which are coupled to respective sample clock inputs;
- the phase detector circuit comprises a plurality of phase inputs and a plurality of corresponding phase outputs, wherein the first latch output of each latch is coupled to a respective one of the plurality of phase inputs; and
- the gate means comprises:
  - means for determining whether the latch outputs of each precharged latch is in the active state or in the precharged state; and
  - means for blocking the phase outputs of the phase detector circuit that correspond to the latch outputs that are in the precharged state.

8. The self-timed phase detector of claim 7 wherein the means for determining generates a data valid signal corresponding to each precharged latch when the respective latch outputs are in the active state and wherein the self-timed phase detector further comprises:
- a multiplexer having a plurality of multiplexer data inputs coupled to the plurality of phase outputs, a plurality of multiplexer control inputs coupled to the means for determining to receive selected data valid signals, and a multiplexer data output coupled to the detector output.

9. The self-timed phase detector of claim 7 and further comprising a voting circuit coupled between the gate means and the detector output.

10. A self-timed phase locked loop detector for locking on to a phase of a bit stream, comprising:
- sample clock generator means for generating a sample clock having an active state, an inactive state and an adjustable delay;
- latch means coupled to the sample clock generator for latching the bit stream under control of the sample clock and for providing first and second complementary latch output signals which follow a relative polarity of the bit stream when the sample clock is in the active state and which have a precharged state when the sample clock is in the inactive state;
- phase detector means coupled to the latch means for generating a phase control signal as a function of whether the phase of the bit stream leads or lags a phase of the sample clock;
- feedback means coupled between the phase detector means and the sample clock generator for adjusting the delay as a function of the phase control signal; and
- gate means coupled to the latch means and between the phase detector means and the feedback means for determining whether the latch output signals are in the precharged state and for blocking the phase control signal when the latch output signals are in the precharged state.

11. A self-timed phase locked feedback loop for locking on to a phase of a serial data stream, comprising:
- a precharged latch having a latch input for receiving the serial data stream, a sample clock input, and first and second complementary latch outputs which have an active state and a precharged state;
- a phase detector having a phase detector input coupled to the first latch output and having a phase control output, wherein the phase detector generates a phase control signal on the phase control output;
- a feedback loop having a phase control input coupled to the phase control output and having a sample clock output coupled to the sample clock input, wherein the feedback loop provides a sample clock on the sample clock output which has a phase that is a function of the phase control signal;
- a data valid detector coupled to the latch outputs and having a data valid output, wherein the data valid detector detects whether the latch outputs are in the precharged state and generates a data invalid signal on the data valid output when the latch outputs are in the precharged state; and
- a phase update blocking circuit coupled to the data valid output and between the phase control output and the phase control input, which blocks the phase control signal when the data invalid signal is present on the data valid output.

12. The self-timed phase detector of claim 11 wherein feedback loop comprises:
- a charge pump coupled to the phase control input and having a charge pump output;
- a loop filter coupled to the charge pump output; and
- a voltage controlled oscillator coupled between the loop filter and the sample clock output.

13. A self-timed phase detector for detecting a phase of an input signal, comprising:
- a detector input for receiving the input signal;
- a detector output;
- a precharged latch having a latch input coupled to the detector input, a sample clock input, and first and second complementary latch outputs which have an active state and a precharged state;
- a sample clock generator coupled to the sample clock input;
- a phase detector circuit having a phase input coupled to the first latch output and having a phase output, wherein the phase detector circuit provides a phase signal on the phase output;

an exclusive-OR logic gate having a first input coupled to the first latch output, a second input coupled to the second latch output and a data valid output; and an AND logic gate having a first input coupled to the data valid output, a second input coupled to the phase output and a gate output coupled to the detector output.

14. A method of locking onto a phase of an input signal, comprising:

applying the input signal to a latch having precharged, complementary latch outputs;

generating a sample clock having active and inactive states;

operating the latch with the sample clock such that the latch outputs are in complementary logic states when the sample clock is in the active state and are in a common, precharged state when the sample clock is in the inactive state;

generating a phase control signal as a function of a difference between the phase of the input signal and a phase of the sample clock;

adjusting the phase of the sample clock as a function of the phase control signal;

determining whether the latch outputs are in the precharged state; and preventing adjustment of the phase of the sample clock when the latch outputs are in the precharged state.

15. The method of claim 14 wherein the step of determining whether the latch outputs are in the precharged state comprises determining whether the latch outputs have a same logic state.

16. The method of claim 15 wherein the step of determining further comprises performing an exclusive-OR function on the latch outputs and generating a data valid signal if the exclusive-OR function has a logic true result and a data invalid signal if the exclusive-OR function has a logic false result.

17. The method of claim 14 wherein the step of preventing adjustment comprises blocking the phase control signal when the latch outputs are in the precharged state.

* * * * *